US009495101B2

(12) United States Patent
Lieber (10) Patent No.: US 9,495,101 B2
(45) Date of Patent: Nov. 15, 2016

(54) METHODS FOR BALANCING WRITE OPERATIONS OF SLC BLOCKS IN DIFFERENT MEMORY AREAS AND APPARATUS IMPLEMENTING THE SAME

(71) Applicant: SanDisk Technologies Inc., Plano, TX (US)

(72) Inventor: Opher Lieber, Hadera (IL)

(73) Assignee: SanDisk Technologies LLC, Plano, TX (US)

( * ) Notice: Subject to any disclaimer, the term of this patent is extended or adjusted under 35 U.S.C. 154(b) by 84 days.

(21) Appl. No.: 14/167,953

(22) Filed: Jan. 29, 2014

(65) Prior Publication Data

US 2015/0213896 A1    Jul. 30, 2015

(51) Int. Cl.
| | | |
|---|---|---|
| *G06F 12/00* | (2006.01) | |
| *G06F 3/06* | (2006.01) | |
| *G11C 16/10* | (2006.01) | |
| *G11C 16/34* | (2006.01) | |
| *G11C 11/56* | (2006.01) | |

(52) U.S. Cl.
CPC ............ *G06F 3/061* (2013.01); *G11C 11/5628* (2013.01); *G11C 16/10* (2013.01); *G11C 16/349* (2013.01); *G11C 16/3418* (2013.01); *G11C 16/3495* (2013.01); *G06F 3/0616* (2013.01); *G06F 3/0679* (2013.01); *G06F 2212/7211* (2013.01); *G11C 2211/5641* (2013.01)

(58) Field of Classification Search
CPC .................. G06F 3/061; G06F 3/0679; G06F 3/616; G06F 2212/7211; G11C 16/10; G11C 16/3418; G11C 16/3495; G11C 16/349; G11C 11/5628; G11C 2211/5641
See application file for complete search history.

(56) References Cited

U.S. PATENT DOCUMENTS

| | | | | |
|---|---|---|---|---|
| 8,601,202 | B1 * | 12/2013 | Melcher .............. | G06F 12/0246 711/103 |
| 2007/0288712 | A1 * | 12/2007 | Zimoto et al. ................ | 711/162 |
| 2008/0016269 | A1 * | 1/2008 | Chow et al. .................. | 711/103 |
| 2008/0104309 | A1 * | 5/2008 | Cheon ................. | G06F 12/0246 711/103 |
| 2009/0172333 | A1 * | 7/2009 | Marcu et al. ................. | 711/165 |
| 2013/0179624 | A1 * | 7/2013 | Lambert ............. | G06F 12/0246 711/103 |

* cited by examiner

*Primary Examiner* — Kalpit Parikh
(74) *Attorney, Agent, or Firm* — Martine Penilla Group, LLP (57) ABSTRACT

Data is received at a computer memory to be programmed in single-level-cell mode. A stress level of a first section of the computer memory is determined. A stress level of a second section of the computer memory is determined. The stress levels of the first and second sections of the computer memory are compared to determine which one of the first and second sections is a less stressed single-level-cell mode section of the computer memory. The data received at the computer memory is programmed in the less stressed single-level-cell mode section of the computer memory.

14 Claims, 7 Drawing Sheets

METHODS FOR BALANCING WRITE OPERATIONS OF SLC BLOCKS IN DIFFERENT MEMORY AREAS AND APPARATUS IMPLEMENTING THE SAME

BACKGROUND

Non-volatile NAND-based Flash memory systems are widely used in modern digital computing devices, such as mobile phones, digital cameras, digital camcorders, computers, and many other digital computing devices. In current NAND-based Flash memory systems, a multi-level cell (MLC) can be operated to store 2 or 3 bits per cell. With this advancement in MLC use, it becomes necessary to apply a memory programming plan to eliminate data corruption as a result of various effects, such as the so-called Yupin effect as described in U.S. Patent Application Publication No. US 2003/0235078.

Such a memory programming plan includes directing specific operations toward the NAND-based Flash memory in order to complete an MLC programming step. Additionally, in eX2 Flash technology where 2 bits are stored in each MLC, there is a tight connection between lower and upper pages. In this situation, if a power failure occurs during programming of the upper page, the lower page might be affected. Due to the above-mentioned reasons, among others, operation of eX2, ex3, etc., NAND-based Flash memory often includes holding enough host data in single-level cell (SLC) mode before completing an MLC programming step to ensure data recoverability. Such holding of data in SLC mode is referred to as operation of a "safe-zone." It is within this context that the present invention arises.

SUMMARY

In one embodiment, a method is disclosed for operating a computer memory. The method includes receiving data at the computer memory to be programmed in single-level-cell mode within the computer memory. The method also includes determining a stress level of a first section of the computer memory. The method also includes determining a stress level of a second section of the computer memory. The method also includes comparing the stress levels of the first and second sections of the computer memory to determine which one of the first and second sections is a less stressed single-level-cell mode section of the computer memory. The method then proceeds with programming the data received at the computer memory in the less stressed single-level-cell mode section of the computer memory.

In another embodiment, a method is disclosed for operating a computer memory. The method includes receiving data at the computer memory to be programmed in single-level-cell mode within the computer memory. The method also includes determining a stress level of a first section of the computer memory. If the stress level of the first section of the computer memory is less than a current stress level threshold applied to the first section of the computer memory, the method proceeds with programming the data received at the computer memory in single-cell-level mode in the first section of the computer memory. If the stress level of the first section of the computer memory is more than the current stress level threshold applied to the first section of the computer memory, the method proceeds with 1) programming the data received at the computer memory in single-cell-level mode in a second section of the computer memory, and 2) then swapping the first and second section designations of the computer memory for a subsequent receipt of data at the computer memory to be programmed in single-level-cell mode.

In another embodiment, a computer memory system is disclosed. The computer memory system includes a NAND-based memory structure including an intermediate storage section and a main storage section. The intermediate storage section includes single-level-cell storage elements. The main storage section includes hybrid storage elements defined to operate in either a single-level-cell mode or a multi-level-cell mode. The main storage section includes a first portion having hybrid storage elements controlled to operate only in the single-level cell mode. The main storage section also includes a second portion having hybrid storage elements controlled to operate in only the multi-level-cell mode. The computer memory system also includes a memory controller defined to receiving data to be programmed in single-level-cell mode within the NAND-based memory structure. The memory controller is also defined to determine a stress level of the intermediate storage section. The memory controller is also defined to determine a stress level of the first portion of the main storage section. The memory controller is also defined to compare the stress levels of the intermediate storage section and the first portion of the main storage section to determine which one of the intermediate storage section and the first portion of the main storage section is a less stressed single-level-cell mode section. The memory controller is also defined to program the received data in the less stressed single-level-cell mode section.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
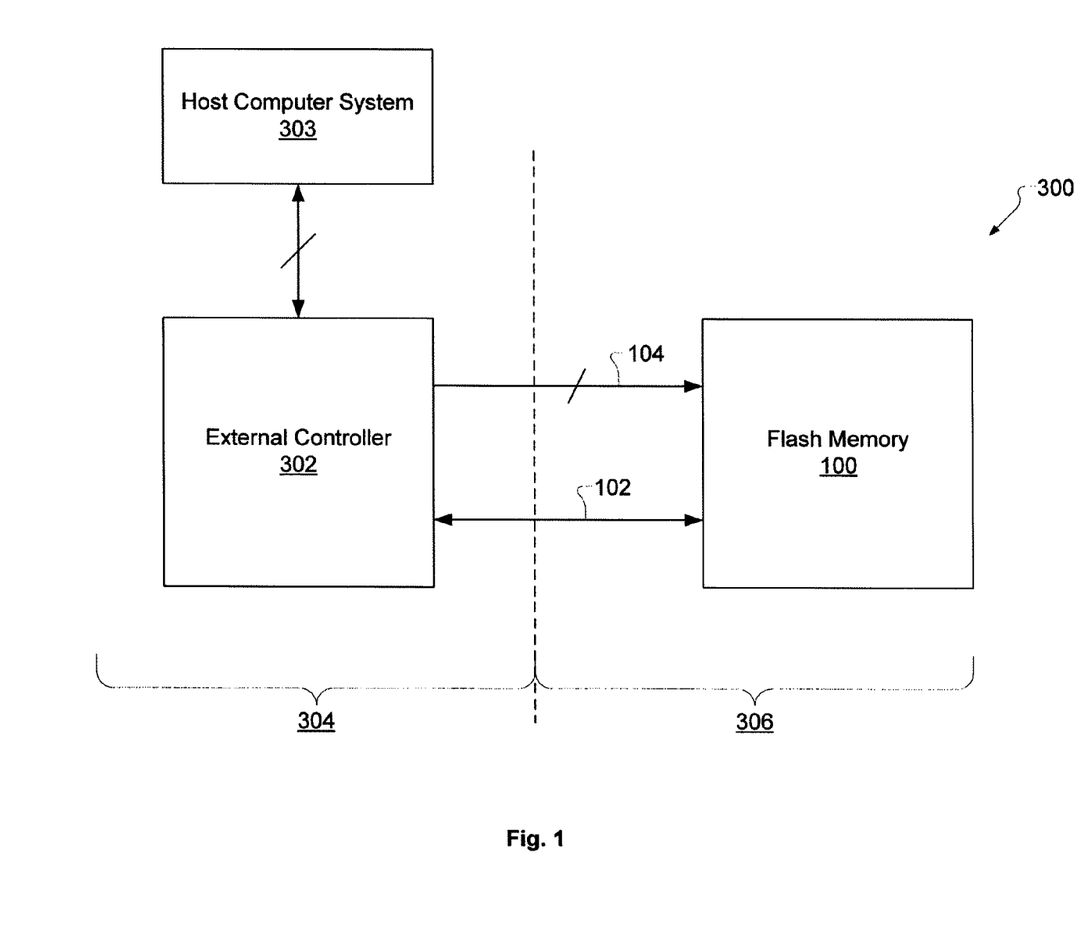
FIG. 1 is a high-level schematic block diagram of a flash memory device in which a flash memory is controlled by an external controller, in accordance with one embodiment of the present invention.

FIG. 1 shows a high-level schematic block diagram of a NAND-based flash memory device 300 in which a flash memory 100 is controlled by an external controller 302, in accordance with one embodiment of the present invention. It should be understood that the memory device 300 shown in FIG. 1 is provided as an example. In other embodiments, the invention disclosed herein can be equivalently practiced with variations of the memory device 300 of FIG. 1. And, in other embodiments, the invention disclosed herein can be practiced with memory devices 300 different from that shown in FIG. 1.

In the memory device 300, the external controller 302 is defined to be electronically connected to a host computer system 303, such as a personal computer, a digital camera, a personal digital assistant, or essentially any other type of computer device that includes a digital processor. The host computer system 303 transmits commands to the external controller 302, such as commands to write data to or read data from the flash memory 100. The host computer system 303 also provides data to be written to, i.e., stored in, the memory 100 to the external controller 302, and receives data read from the memory 100 from the external controller 302. The external controller 302 is defined to generate and transmit command signals 104 to the flash memory 100, such that the command signals 104 can be interpreted and executed by the flash memory 100. The external controller 302 is also defined to transmit data to the flash memory over an I/O (input/output) bus 102 for storage within the flash memory 100, and receive read data over the I/O bus 102 from the flash memory 100. Also, the external controller 302 can include a buffer memory for temporary storage of data being written to or read from the flash memory 100.

In one embodiment, the memory device 300 includes one integrated circuit chip 304 that includes the external controller 302, and one or more integrated circuit chips 306 that include the flash memory 100. In one embodiment, the flash memory 100 is defined on a single integrated circuit chip. However, it should be understood that in other embodiments, the flash memory 100 can be defined across multiple integrated circuit chips that are each connected to electronically communicate with the external controller 302. Also, it should be understood that the memory device 300 may be embedded as part of the host computer system 303, or may be included in a memory card that is removably insertable into a mating socket of the host computer system 303. Such a memory card may include the entire memory device 300, or portions of the memory device 300, with a remainder of the memory device 300 defined on other components interfaced with the host computer system and/or memory card.

Figure 2:
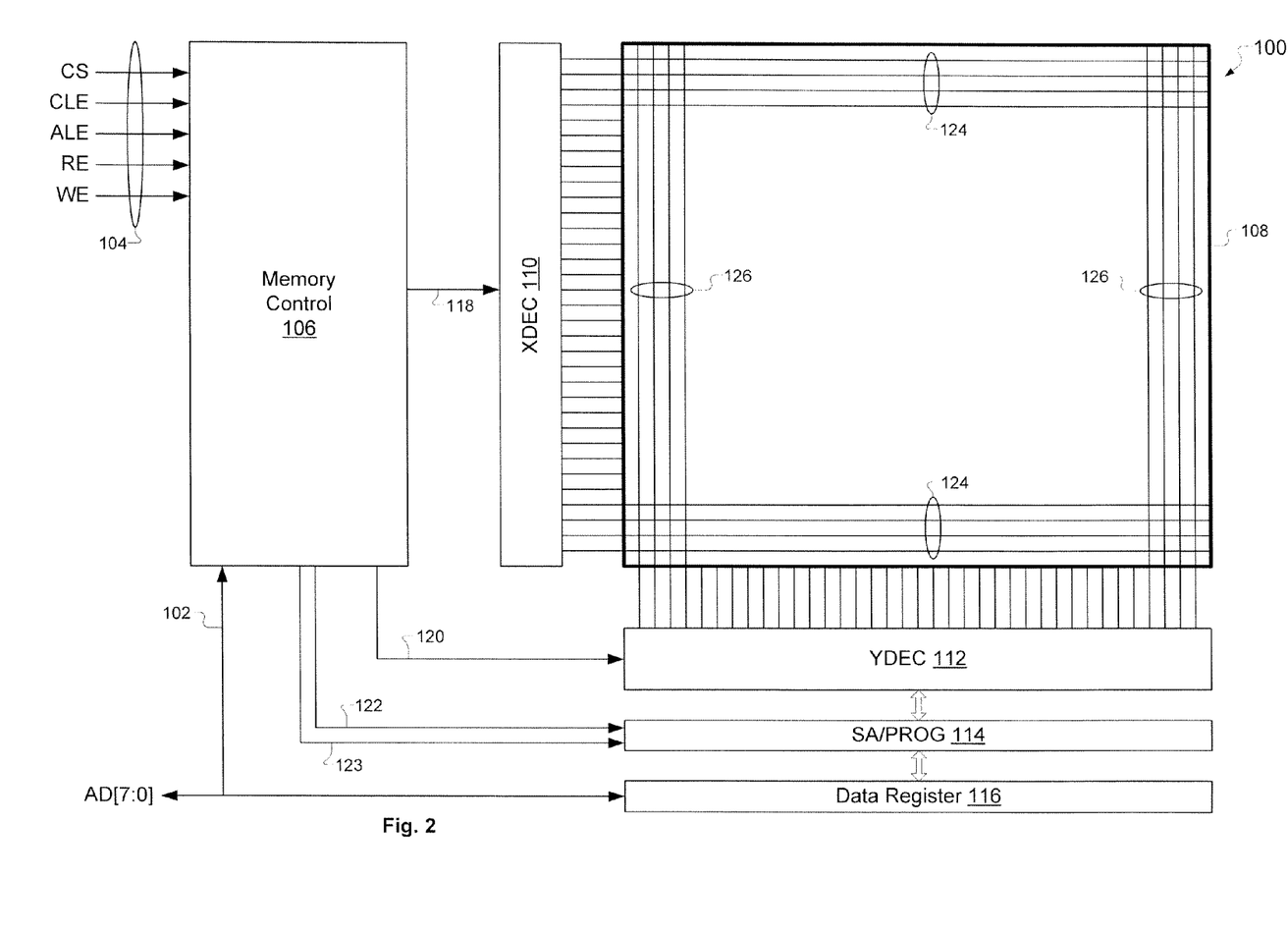
FIG. 2 shows an exemplary internal architecture for the flash memory, in accordance with one embodiment of the present invention.

FIG. 2 shows an exemplary internal architecture for the flash memory 100, in accordance with one embodiment of the present invention. The flash memory 100 includes a memory control circuit 106 defined to control internal memory operations. The memory control circuit 106 includes registers for command, address and status signals. The memory control circuit 106 is connected to receive signals on an input/output (I/O) bus 102 and to receive control signals 104 from the external controller 302. The flash memory 100 includes one or more arrays 108 of storage elements. In one embodiment, the storage elements within the array 108 are defined as flash EEPROM cells.

Each array 108 storage element has an associated row decoder (XDEC) 110, an associated column decoder (YDEC) 112, an associated group of sense amplifiers and program control circuitry (SA/PROG) 114, and an associated data register 116.

In one embodiment, the control signals 104 include:
CS: Chip Select Signal: The CS signal is used to activate the flash memory 100 interface. If the CS signal is not asserted, the flash memory 100 will remain in standby mode and will not respond to other control signals.
CLE: Command Latch Enable Signal: The CLE signal controls the activating path for commands sent to the command register of the memory control circuit 106. When the CLE signal is asserted, commands are latched into the command register of the memory control circuit 106.
ALE: Address Latch Enable Signal: The ALE signal controls the activating path for addresses sent to the address register of the memory control circuit 106. When the ALE signal is asserted, addresses are latched into the address register of the memory control circuit 106.
RE: Read Enable Signal: The RE signal enables the data output buffers. When the RE signal is asserted, the read data is driven onto I/O bus 102.
WE: Write Enable Signal: The WE signal controls writing of data to the I/O port. Assertion of the WE signal provides for clocking of data, addresses, and/or commands into the flash memory 100.
AD[7:0]: Data on I/O bus 102: The I/O bus 102 is used to transfer data between a data bus controller and the flash memory 100 command, address, and data registers of the memory control circuit 106.

In addition to the above-mentioned control signals 104, the memory 100 also includes a means by which a storage subsystem controller may determine that the memory 100 is busy performing some task. Such means could include a dedicated signal or a status bit in an internal memory register that is accessible while the memory 100 is busy. It should be understood that the control interface defined by the above-mentioned control signals 104 is provided by way of example. In other embodiments, the control interface may include signals other than those discussed above to provide equivalent or expanded control of the memory 100. Additionally, it should be understood that while the example embodiment of FIG. 2 shows one flash memory array 108 with its associated components, other embodiments can include multiple arrays 108 as part of a given flash memory 100, where the multiple arrays 108 share a common interface 104 and memory control circuit 106, but have separate respective XDEC 110, YDEC 112, SA/PROG 14, and data register 116 circuitry in order to allow parallel read and program, i.e., write, operations.

During a read operation, data is transferred from the memory array 108 through the data register 116 to an external controller via the I/O bus 102. Data register 116 is also electrically connected to the SA/PROG (sense amplifier/programming) circuit 114. The number of storage elements of data register 116 that are connected to each SA/PROG circuit 114 element may depend on the number of bits stored in each storage element of the array 108. The SA/PROG circuit 114 is connected to a sense enable line 122 that when activated causes the SA/PROG circuit 114 to operate in a sense mode. Also, the SA/PROG circuit 114 is connected to a program enable line 123 that when activated causes the SA/PROG circuit 114 to operate in a program/verify mode.

The rows 124 of array 108 correspond to word lines. The columns 126 of array 108 correspond to bit lines. To avoid unnecessarily obscuring the array 108 of FIG. 2, only the first and last four rows 124 (word lines), and only the first and last four columns 126 (bit lines) are explicitly shown. However, it should be understood that the actual number of rows 124 (word lines) and columns 126 (bit lines) in the array 108 is dependent on the number of storage elements in the array 108, with each storage element have one row 124 (word line) and two columns 126 (bit lines). A storage element is positioned in the array 108 at each intersection of the rows 124 (word lines) and the columns 126 (bit lines). In one embodiment, the array 108 of storage elements includes one or more conductive floating gates as storage elements. However, in other embodiments, the array 108 of storage elements includes other types of long-term electron charge storage elements.

The row decoder XDEC 110 is defined to decode row addresses for array 108 in order to select the physical page to be accessed. The row decoder XDEC 110 receives row addresses via internal row address lines 118 from the memory control circuit 106. The column decoder YDEC 112 receives column addresses via internal column address lines 120 from the memory control circuit 106.

Figure 3:
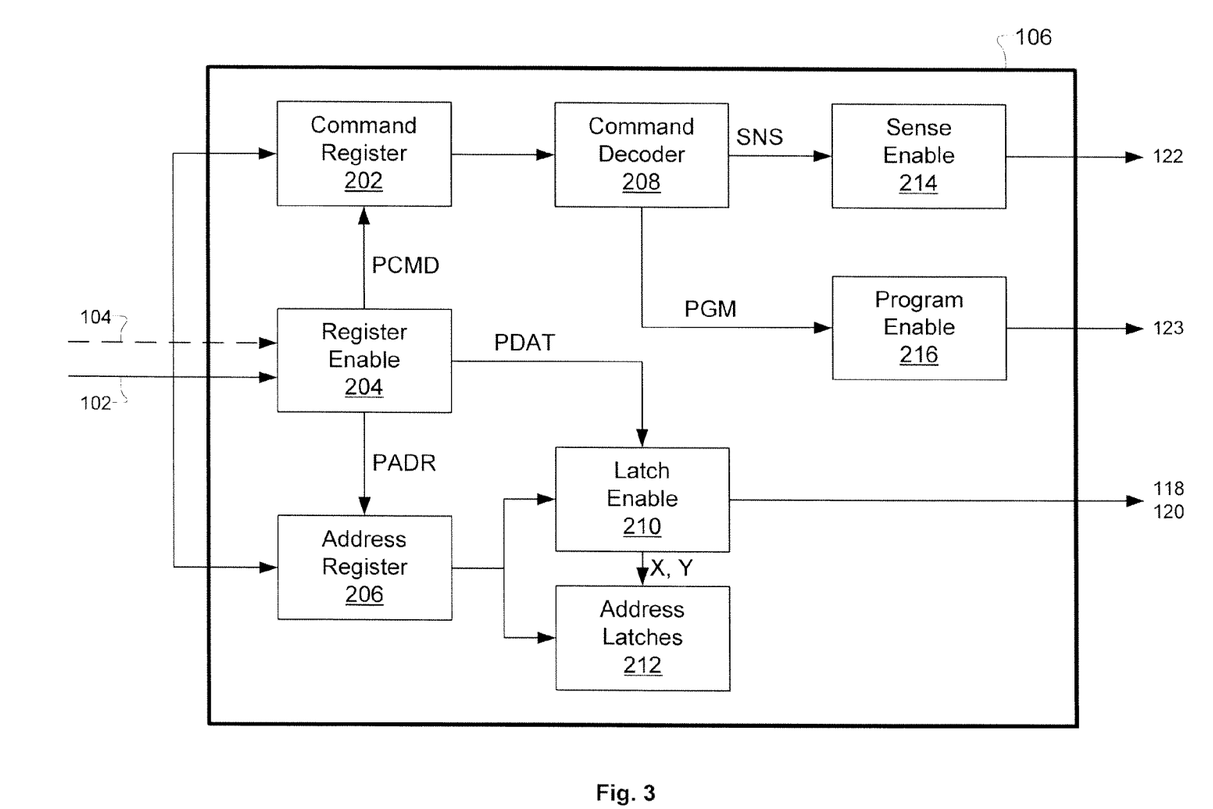
FIG. 3 shows a simplified block diagram of the memory control circuit, in accordance with one embodiment of the present invention.

FIG. 3 shows a simplified block diagram of the memory control circuit 106, in accordance with one embodiment of the present invention. The memory control circuit 106 includes a register enable circuit 204 that has outputs coupled to an address register 206, a command register 202 and a latch enable circuit 210, respectively. Upon receiving from the external controller an ALE control signal 104 indicating that an address descriptor is to follow, the register enable circuit 204 activates an enable line PADR (physical address register), which causes a subsequent chunk address descriptor received from the external controller over I/O bus 102 to be latched in to address register 206. The latch enable circuit 210, which is connected to the address register 206, then activates latch enable lines X and Y to latch the chunk address stored in address register 206 into appropriate row and column latches of address latches 212. The chunk addresses stored in address latches 212 are then provided over appropriate lines of internal row address lines 118 to row decoder XDEC 110, and over internal column address lines 120 to column decoder YDEC 112.

Upon receiving from the external controller a control signal 104 that indicates that data is to follow, i.e., that data is to be programmed/written into the memory array 108, the register enable circuit 204 activates an enable line PDAT (program data signal) that causes a chunk of data received over I/O bus 102 to be latched into the data register 116. Upon receiving from the external controller a CLE control signal 104 that indicates that a command is to follow, the register enable circuit 204 activates an enable line PCMD (program/write command), which causes a subsequent read or write command received from the external controller over I/O bus 102 to be latched into the command register 202.

A command decoder 208 then reads the command stored in command register 202. If the command is a program/write command, the command decoder 208 decodes the command to activate a program line PGM connected to a program enable circuit 216. The program enable circuit 216 receives the activate signal on the program line PGM and the most significant bit from the chunk address stored in address register 206. Then, the program enable circuit 216 transmits signals over the program enable lines 123 to the SA/PROG circuit 114, directing the SA/PROG circuit 114 to selectively activate its program/verify mode of operation to program the data in data register 116 into memory array 108.

If the command is a read command, the command decoder 208 decodes the command to activate a sense line SNS connected to a sense enable circuit 214 that in turn transmits signals over the sense enable line 122 to direct the SA/PROG circuit 114 to selectively activate its sense mode of operation to sense the threshold voltages stored in the storage elements at the intersections of the latched row 124 (word line) and the latched columns 126 (bit lines) of memory array 108. The results of the sensing are loaded into data register 116, for subsequent reading by the external controller.

In the flash memory 100, each storage element within the array 108 includes a transistor having both a control gate and a floating gate. It should be understood that the memory operation for storing data in the memory can be referred to interchangeably as a program operation, a write operation, or program/write operation. When data is programmed/written to the storage element, electrons are injected into the floating gate of the storage element's transistor. The injected electrons oppose a reference voltage applied to the control gate. The transistor of the storage element does not turn on, i.e., conduct, unless the reference voltage applied to its control gate is sufficiently high to overcome a charge present on its floating gate. The lowest voltage that can be applied to the control gate to overcome the charge on the floating gate is referred to as the threshold voltage of the transistor of the storage element.

The threshold voltage of a storage element resides within a voltage range extending from a minimum voltage ($V_{min}$) to a maximum voltage ($V_{max}$). The threshold voltage range of the storage element is divided into a number of voltage bins, where each voltage bin corresponds to a particular bit pattern stored in the storage element. A threshold voltage set within a particular voltage bin represents storage of a bit pattern that uniquely corresponds to the particular voltage bin. Therefore, the number of bits that can be stored by a given storage element is dependent upon the number of voltage bins into which the threshold voltage range is divided. More specifically, the threshold voltage range of a storage element that stores n bits is divided into $2^n$ voltage bins. For each storage element in the array 108 that is operated in SLC mode, the value of n equals 1, and the storage element in SLC mode has 2 voltage bins. And, each storage element in the array 108 that is operated in MLC mode to store up to n bits of data has $2^n$ voltage bins.

During a program/write operation, voltage pulses are applied to the transistor of the storage element to inject electrons into the floating gate of the storage element's transistor until a threshold voltage is established within the transistor of the storage element that exceeds a verify voltage level associated with a particular bit pattern to be stored within the storage element. During a read operation, the sensed threshold voltage of the storage element is compared to reference voltage levels that define the boundaries of the voltage bins into which the threshold voltage range is divided so as to identify the voltage bin in which the sensed threshold voltage resides, which in turn identifies the bit pattern stored in the storage element.

Figure 4:
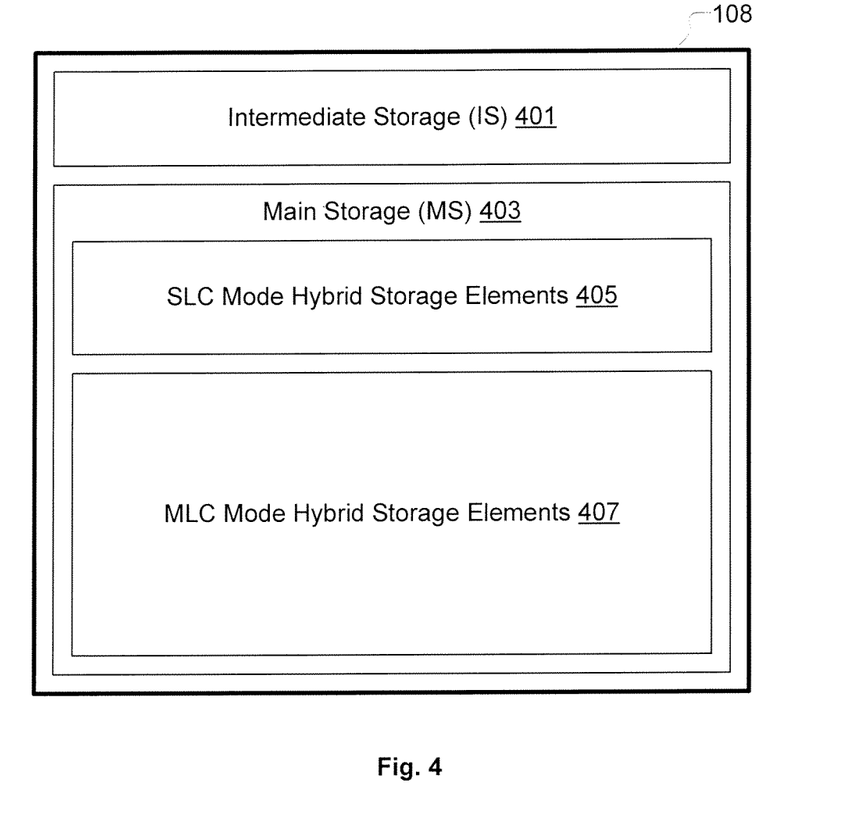
FIG. 4 shows an arrangement of storage elements within the array of the flash memory, in accordance with one embodiment of the present invention.

FIG. 4 shows an arrangement of storage elements within the array 108 of the flash memory 100, in accordance with one embodiment of the present invention. The array 108 includes an intermediate storage (IS) section 401 in which the storage elements are defined as SLC storage elements. The array also includes a main storage (MS) section 403 in which the storage elements are defined as MLC storage elements. More specifically, each storage element in the main storage (MS) section 403 is a hybrid storage element that can be operated in either SLC mode or MLC mode at any given time, as directed by the memory control circuit 106 according to the flash management needs and depending on the type of data (random data, sequential data, burst data) and content of the data and associated program/write command. Again, it should be understood that the terms "program" and "write" as used herein with regard to data storage in computer memory are synonymous and interchangeable.

When operated in SLC mode, the hybrid storage element stores 1 bit of data. When operated in MLC mode, the hybrid storage element can store multiple bits of data. For example, in eX2 flash memory technology, the hybrid storage element operated in MLC mode can store 2 bits of data. Also, in eX3 flash memory technology, the hybrid storage element operated in MLC mode can store 3 bits of data. It should be understood that a hybrid storage element operated in MLC mode, as referred to herein, can store 2 or more bits of data, and a hybrid storage element operated in SLC mode as referred to herein can store 1 bit of data. The main storage (MS) section 403 includes a sub-section of SLC mode hybrid storage elements 405, and a sub-section of MLC mode hybrid storage elements 407.

It should be understood that the separation between the SLC mode hybrid storage elements 405 and the MLC mode hybrid storage elements 407 within the main storage (MS) section 403 as shown in FIG. 4, is not intended to imply any limitation on physical location of SLC mode versus MLC hybrid storage elements within the main storage (MS) section 403. The depiction of the main storage (MS) section 403 in FIG. 4 showing the SLC mode hybrid storage elements 405 as being physically and/or logically organized separate from the MLC mode hybrid storage elements 407 corresponds to one example embodiment provided for ease of description. It should be understood that at any given moment, any of the hybrid storage elements within the entirety of the main storage (MS) section 403 can be controlled to operate in either SLC mode or MLC mode. Therefore, in other embodiments, it is not necessary for the SLC mode hybrid storage elements 405 to be physically and/or logically organized separate from the MLC mode hybrid storage elements 407 within the main storage (MS) section 403.

The intermediate storage (IS) section 401 can be operated as a safe-zone to store host data in SLC storage elements, or at least some of it, prior to programming/writing the host data to MLC storage elements 407 in the main storage (MS) section 403. When the intermediate storage (IS) section 401 becomes full of programmed data, or reaches a specified threshold amount of programmed data, an internal memory folding operation is performed to flush/relocate the programmed data from the intermediate storage (IS) section 401 to the MLC storage elements 407 in the main storage (MS) section 403.

Also, in addition to providing the safe-zone for storing host data, the SLC blocks of the intermediate storage (IS) section 401 can be used by the memory device 300 to provide burst performance to the host computer system 303. More specifically, because SLC storage elements can be programmed/written faster than MLC/hybrid storage elements, operating the memory device 300 to write more host data to the SLC storage elements of the intermediate storage (IS) section 401, as opposed to the MLC hybrid storage elements 407 of the main storage (MS) section 403, will increase the speed of the host data program/write operation, thereby freeing up the memory sooner for a subsequent operation to provide the burst performance. In some embodiments, the SLC storage elements can be programmed two times faster than the MLC storage elements that store 2 bits of data. And, in some embodiments, the SLC storage elements can be programmed four times faster than the MLC storage elements that store 3 bits of data.

In some embodiments, the host computer system 303 can direct the memory device 300 to operate in burst performance mode. In other embodiments, the memory device 300 is defined to detect when the host computer system 303 will benefit from burst performance and operate accordingly to self-actuate burst performance mode when appropriate. It should be understood that the intermediate storage (IS) section 401 is a smaller storage section in comparison to the main storage (MS) section 403, but the intermediate storage (IS) section 401 is a faster storage section in comparison to the main storage (MS) section 403, and is capable of operating as a limited capacity data caching area.

The hybrid storage elements of the main storage (MS) section 403 can be programmed in either SLC mode or MLC mode. After each block erase operation, it is possible to assign a given block of storage elements in the main storage (MS) section 403 to operate in either SLC mode or MLC mode, regardless of the mode in which the given block was previously operated. However, programming/writing a hybrid storage element in SLC mode has nearly the same endurance penalty as programming/writing the hybrid storage element in MLC mode. Therefore, if an MLC storage element has an expected lifetime of 2,000 P/E (program/erase) cycles, a given hybrid storage element will also have an expected lifetime of 2,000 P/E cycles, regardless of how many of the given hybrid storage element's P/E cycles are performed in SLC mode versus MLC mode.

As a point of comparison, a pure SLC storage element, such as in the intermediate storage (IS) section 401, can have an expected lifetime of 20,000 P/E cycles. Therefore, the hybrid storage elements of the main storage (MS) section 403 have a much lower endurance, i.e., expected lifetime, as compared to the SLC storage elements of the intermediate storage (IS) section 401. However, the main storage (MS) section 403 is generally much bigger than the intermediate storage (IS) section 401. For example, in one embodiment, the intermediate storage (IS) section 401 can be defined to store about 50 SLC blocks per plane, out of 1000 blocks per plane. Therefore, when it is required to program/write host data in SLC mode, for capacity reasons it may be advantageous or necessary to program/write the host data to the SLC mode hybrid storage elements 405 in the main storage (MS) section 403, as opposed to the SLC storage elements in the intermediate storage (IS) section 401. Generally speaking, when a given hybrid storage element of the main storage (MS) section 403 is operated in SLC mode the given hybrid storage element will have a performance, e.g., program/write speed, similar to the SLC storage element of the intermediate storage (IS) section 401, but even in the SLC mode the given hybrid storage element 405 will retain the lower endurance of the MLC storage element.

As discussed above, the SLC storage elements of the intermediate storage (IS) section 401 provide fast program/write speed and long endurance, whereas the SLC mode hybrid storage elements 405 of the main storage (MS) section 403 also provide fast program/write speed but shorter endurance. However, the intermediate storage (IS) section 401 is limited in size/storage capacity, whereas the size/storage capacity of the SLC mode hybrid storage elements 405 in the main storage (MS) section 403 is larger, and in some embodiments can be adjusted as needed.

One objective in operating the memory device 300 is to maximize usage of the available P/E cycles of both the SLC storage elements in the intermediate storage (IS) section 401 and the SLC mode hybrid storage elements 405 in the main storage (MS) section 403. Therefore, when the memory controller, such as the external controller 302 of FIG. 1, directs the memory 100 to program/write data to SLC storage elements for a given reason (whether due to a programming plan, a safe-zone operation, for burst performance, etc.), it is necessary to determine whether the data is to be programmed/written to SLC storage elements in the intermediate storage (IS) section 401 or to SLC mode hybrid storage elements in the main storage (MS) section 403.

Figure 5:
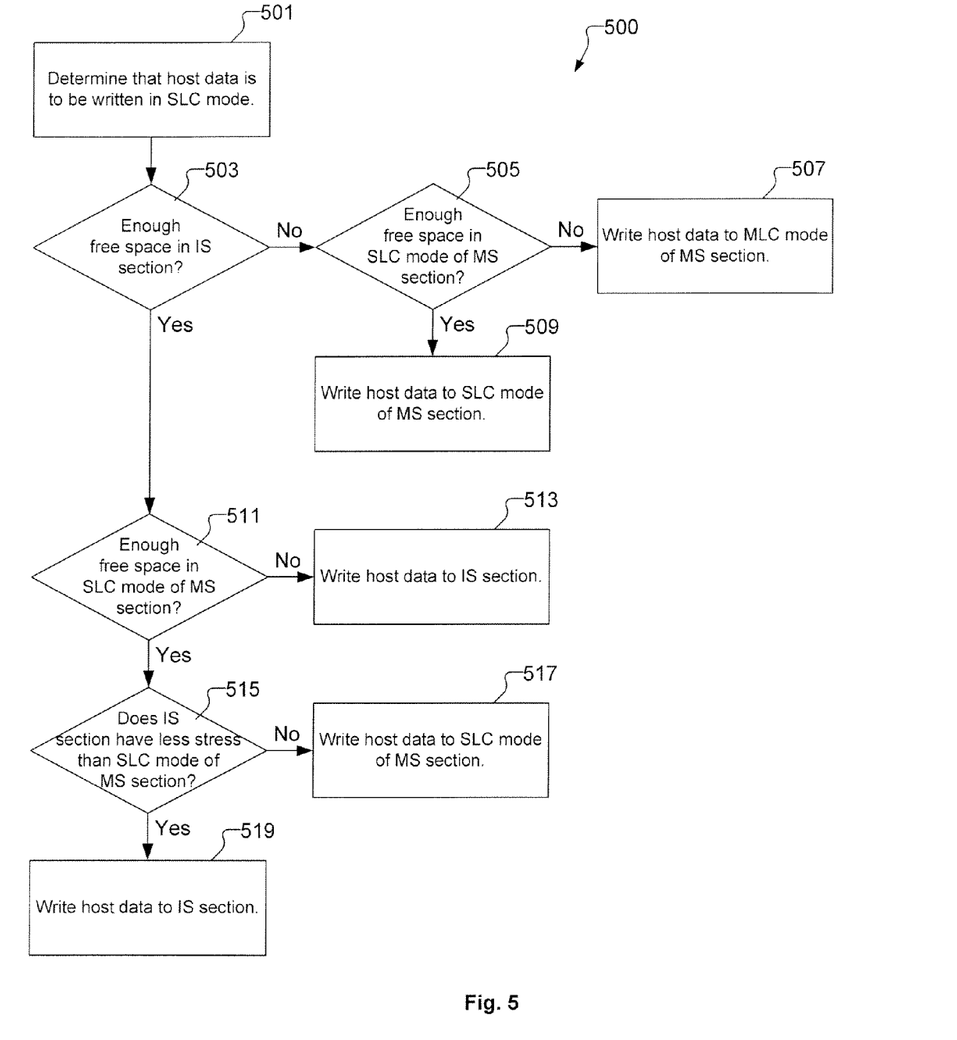
FIG. 5 shows a flowchart of a method for determining whether an SLC data write operation is to be directed to SLC storage elements in the intermediate storage (IS) section or to SLC mode hybrid storage elements in the main storage (MS) section, in accordance with one embodiment of the present invention.

FIG. 5 shows a flowchart of a method 500 for determining whether an SLC data write operation is to be directed to SLC storage elements in the intermediate storage (IS) section 401 or to SLC mode hybrid storage elements 405 in the main storage (MS) section 403, in accordance with one embodiment of the present invention. It should be understood that the method 500 of FIG. 5 is defined to maximize usage of the available P/E cycles of the both the SLC storage elements in the intermediate storage (IS) section 401 and the SLC mode hybrid storage elements 405 in the main storage (MS) section 403. Therefore, the method 500 of FIG. 5 provides for balancing of SLC write operations in a flash memory management system between different storage areas in the memory device. More specifically, the method 500 of FIG. 5 balances write operations in SLC mode between the intermediate storage (IS) section 401 and the SLC mode hybrid storage elements 405 in the main storage (MS) section 403, such that data is written in SLC mode either to the intermediate storage (IS) section 401 or the SLC mode hybrid storage elements 405 in the main storage (MS) section 403, so as to maintain a balance in stress of those storage sections 401 and 405. In one embodiment, the stress of a given memory storage section is quantified as the percentage of expected lifetime P/E cycles of the given memory storage section that has been used.

The method 500 begins with an operation 501 in which a determination is made that host data is to be written in SLC mode in the memory, such as the memory 100. In one embodiment, the determination of operation 501 is performed by the external controller 302 of the memory device 300. Also, in various embodiments, the determination to write host data in SLC mode can be directed by the host computer system 303, or can be decided by the external controller 302 based on memory performance and/or the type of data (random, sequential, burst, etc.) being written.

Once it is determined that the host data is to be written in SLC mode, the method proceeds with an operation 503 to determine whether or not enough free space is available in the intermediate storage (IS) section 401 to accommodate writing of the host data. If there is not enough free space available in the intermediate storage (IS) section 401, the method proceeds with an operation 505 to determine whether or not enough free space is available in the SLC mode hybrid storage elements 405 of the main storage (MS) section 403 to accommodate writing of the host data. If there is not enough free space available in the SLC mode hybrid storage elements 405 of the main storage (MS) section 403, the method proceeds with an operation 507 to write the host data in MLC mode to the MLC mode hybrid storage elements 407 in the main storage (MS) section 403. Also, in accordance with the operation 507, the memory device 300 may initiate a folding operation to transfer data from the intermediate storage (IS) section 401 and/or from the SLC mode hybrid storage elements 405 of the main storage (MS) section 403 to the MLC mode hybrid storage elements 407 in the main storage (MS) section 403, in order to free up SLC mode storage elements for subsequent SLC mode write operations. If the operation 505 determines that there is enough free space available in the SLC mode hybrid storage elements 405 of the main storage (MS) section 403, the method proceed with an operation 509 to write the host data in SLC mode to the SLC mode hybrid storage elements 405 in the main storage (MS) section 403.

With reference back to operation 503, if it is determined that there is enough free space in the intermediate storage (IS) section 401 to accommodate writing of the host data, the method proceeds with an operation 511 to determine whether or not enough free space is available in the SLC mode hybrid storage elements 405 of the main storage (MS) section 403 to accommodate writing of the host data. If it is determined that there is not enough free space available in the SLC mode hybrid storage elements 405 of the main storage (MS) section 403, the method proceed with an operation 513 to write the host data to the SLC storage elements in the intermediate storage (IS) section 401. However, if operation 511 determines that there is enough free space available in the SLC mode hybrid storage elements 405 of the main storage (MS) section 403, then it has been determined that the host data can be written in SLC mode to either intermediate storage (IS) section 401 or to the SLC mode hybrid storage elements 405 of the main storage (MS) section 403, and the method proceeds with an operation 515 to decide where to write the host data based on stress levels of the memory sections 401 and 405.

In the operation 515, a determination is made as to whether or not the intermediate storage (IS) section 401 has less stress than the SLC mode hybrid storage elements 405 of the main storage (MS) section 403. If operation 515 determines that the intermediate storage (IS) section 401 does not have less stress than the SLC mode hybrid storage elements 405 of the main storage (MS) section 403, the method proceeds with an operation 517 to write the host data to the SLC mode hybrid storage elements 405 of the main storage (MS) section 403. However, if operation 515 determines that the intermediate storage (IS) section 401 does have less stress than the SLC mode hybrid storage elements 405 of the main storage (MS) section 403, the method proceeds with an operation 519 to write the host data to the intermediate storage (IS) section 401. In this manner, SLC mode write operations are performed to balance the stress levels of the intermediate storage (IS) section 401 and the SLC mode hybrid storage elements 405 of the main storage (MS) section 403.

In one embodiment, the stress level of the intermediate storage (IS) section 401 considered in operation 515 is quantified as the percent of expected lifetime P/E cycles of the intermediate storage (IS) section 401 that have been utilized. For example, if the expected lifetime P/E cycles of the intermediate storage (IS) section 401 is 20,000, and 4,000 P/E cycles have been utilized, the stress level of the intermediate storage (IS) section 401 is quantified as (4,000/20,000)*100=20% stress level. However, it should be understood that other embodiments can utilize other techniques to quantify the stress level of the intermediate storage (IS) section 401.

Similarly, in one embodiment, the stress level of the SLC mode hybrid storage elements 405 of the main storage (MS) section 403 considered in operation 515 is quantified as the percent of expected lifetime P/E cycles of the SLC mode hybrid storage elements 405 that have been utilized. For example, if the expected lifetime P/E cycles of the SLC mode hybrid storage elements 405 is 2,000, and 500 P/E cycles have been utilized, the stress level of the SLC mode hybrid storage elements 405 is quantified as (500/2,000)*100=25% stress level. However, it should be understood that other embodiments can utilize other techniques to quantify the stress level of the SLC mode hybrid storage elements 405.

It should be understood that quantification of the stress levels of the intermediate storage (IS) section 401 and the SLC mode hybrid storage elements 405 based on their percentage of available P/E cycles that have been utilized allows for a normalized comparison of their respective stress levels even though the intermediate storage (IS) section 401 and the SLC mode hybrid storage elements 405 have different P/E cycle lifetime characteristics. An objective of memory management is to have the stress levels of both the intermediate storage (IS) section 401 and the SLC mode hybrid storage elements 405 reach 100% at about the same time, thereby allowing the memory device 300 to reach its end of life without leaving a substantial amount of unused P/E cycles in either the intermediate storage (IS) section 401 or the SLC mode hybrid storage elements 405. It should be appreciated that because the SLC mode write operation benefits the host device by providing increased write speed, balancing and maximizing use of the available P/E cycles of both the intermediate storage (IS) section 401 and the SLC mode hybrid storage elements 405 optimizes the performance of the memory device 300.

As previously mentioned, the memory device 300 can be operated in burst mode in which host data is written to SLC storage elements, rather than MLC storage elements, to provide for increased write speed performance as afforded by the SLC mode write operation versus MLC mode write operation. It should be appreciated that when operating in burst mode, the memory performance (write speed) can be significantly increased by writing host data strictly to SLC mode storage elements, and by absorbing significant amounts of host data in SLC mode storage elements before starting a folding/relocation operation to transfer the stored data from the SLC mode storage elements to the MLC mode storage elements.

When burst mode is active, the method 500 of FIG. 5 provides for management of the SLC mode write operations so that burst data write events are directed in a substantially balanced manner to either 1) the SLC storage elements (blocks) in the intermediate storage (IS) section 401, with later folding (i.e., copying) into the MLC mode hybrid storage elements 407 in the main storage (MS) section 403, or 2) the SLC mode hybrid storage elements 405 in the main storage (MS) section 403, with later folding (i.e., copying) into the MLC mode hybrid storage elements 407 in the main storage (MS) section 403, so as to maintain a substantially even stress/wear (percentage of expected lifetime P/E cycles utilized) of the SLC storage elements in the intermediate storage (IS) section 401 relative to the SLC mode hybrid storage elements 405 in the main storage (MS) section 403. Therefore, with the methods disclosed herein, it should be appreciated that as the host performs more burst mode data storage operations, each burst mode data storage operation increases the control over balancing stress/wear of the SLC storage elements in the intermediate storage (IS) section 401 relative to the SLC mode hybrid storage elements 405 in the main storage (MS) section 403.

In some embodiments, the memory device 300 will reclaim/free SLC storage elements (blocks) as a background operation, thereby allowing the memory controller to have additional burst mode data write performance on a subsequent host data write request. With the hybrid storage element architecture of the main storage (MS) section 403, burst mode write performance can be defined as the rate at which the memory device 300 can absorb, i.e., process, an input stream of data when there is sufficient free/available SLC mode data storage in the intermediate storage (IS) section 401 and/or SLC mode hybrid storage elements 405 of the main storage (MS) section 403. Therefore, the burst mode write performance of the memory device 300 depends on the write performance of both the intermediate storage (IS) section 401 and/or SLC mode hybrid storage elements 405 of the main storage (MS) section 403.

In one embodiment, the host computer system 303 sends bursts of data to be written in SLC mode into the intermediate storage (IS) section 401, and continues to do so until the memory device 300 directs the data to be written in SLC mode into the SLC mode hybrid storage elements 405 in the main storage (MS) section 403. In one embodiment, the memory device 300 sets a "busy" condition flag to shift the input data stream from writing in the intermediate storage (IS) section 401 to writing in the SLC mode hybrid storage elements 405 in the main storage (MS) section 403.

In one embodiment, the "busy" condition flag is raised by the memory device 300, such as by the external controller 302, upon identifying that the intermediate storage (IS) section 401 has reached a defined stress/wear threshold. Then, upon the intermediate storage (IS) section 401 reaching the defined stress/wear threshold, the incoming bursts of host data are written in SLC mode to the SLC mode hybrid storage elements 405 in the main storage (MS) section 403. Then, the host data will continue to be written in SLC mode to the SLC mode hybrid storage elements 405 in the main storage (MS) section 403 until the SLC mode hybrid storage elements 405 in the main storage (MS) section 403 has reached a defined stress/wear threshold, at which point another "busy" condition flag is raised by the memory device 300, such as by the external controller 302, to shift writing of the host data in SLC mode back to the intermediate storage (IS) section 401, and so on.

In one embodiment, a "burst reserved region" can be set in each of the intermediate storage (IS) section 401 and in the SLC mode hybrid storage elements 405 in the main storage (MS) section 403, where a given burst reserved region is a number of storage blocks reserved for burst mode writing of host data. In one embodiment, a size of the burst reserved region can be dynamically adjusted during runtime for each of the intermediate storage (IS) section 401 and the SLC mode hybrid storage elements 405 in the main storage (MS) section 403, as a function of stress/wear (percentage of expected lifetime P/E cycles utilized) of the SLC storage elements in the intermediate storage (IS) section 401 relative to the SLC mode hybrid storage elements 405 in the main storage (MS) section 403.

For example, if the external controller 302 supports a 400 megabyte (MB) total burst reserved region, the external controller 302 may reserve 200 MB in the intermediate storage (IS) section 401 for burst mode operation and 200 MB in the SLC mode hybrid storage elements 405 in the main storage (MS) section 403 for burst mode operation, assuming the memory device 300 is not logically full. Then, in addition to directing burst mode writing operations to the memory section 401/405 that has less stress/wear (percentage of expected lifetime P/E cycles utilized), as discussed above, the external controller 302 can also operate to dynamically adjust the size of the burst reserved region in each of the intermediate storage (IS) section 401 and the SLC mode hybrid storage elements 405 in the main storage (MS) section 403 based on their respective stress/wear (percentage of expected lifetime P/E cycles utilized).

More specifically, if the SLC mode hybrid storage elements 405 in the main storage (MS) section 403 become more stressed than the intermediate storage (IS) section 401, the external controller 302 can operate to increase the burst reserved region size in the intermediate storage (IS) section 401, and correspondingly decrease the burst reserved region size in the SLC mode hybrid storage elements 405 in the main storage (MS) section 403, vice-versa, thus balancing stress/wear over time between the intermediate storage (IS) section 401 and the SLC mode hybrid storage elements 405 in the main storage (MS) section 403. For example, if the SLC mode hybrid storage elements 405 in the main storage (MS) section 403 become more stressed than the intermediate storage (IS) section 401, the external controller 302 can operate to increase the burst reserved region size in the intermediate storage (IS) section 401 from 200 MB to 300 MB, and correspondingly decrease the burst reserved region size in the SLC mode hybrid storage elements 405 in the main storage (MS) section 403 from 200 MB to 100 MB.

It should be appreciated that although the methods disclosed herein are particularly useful for efficient handling of burst mode write operations, the methods can be equally applied to any SLC mode write operation, such as safe-zone write operations, SLC mode write before copy to eX3 MLC storage, small write operations that cannot be made to eX2 MLC storage elements due to lack of partial page programming (PPP), among others.

It should be appreciated that the methods described herein for balancing stress/wear between different SLC mode sections of the memory provide for full utilization of the expected lifetime P/E cycles of the intermediate storage (IS) section 401 and the SLC mode hybrid storage elements 405 in the main storage (MS) section 403 by the end of the memory device life, regardless of the host computer system 303 scenario. It should also be appreciated that the methods described herein for balancing stress/wear between different SLC mode sections of the memory are also particularly effective when the host computer system 303 performs frequent burst write operations.

Figure 6:
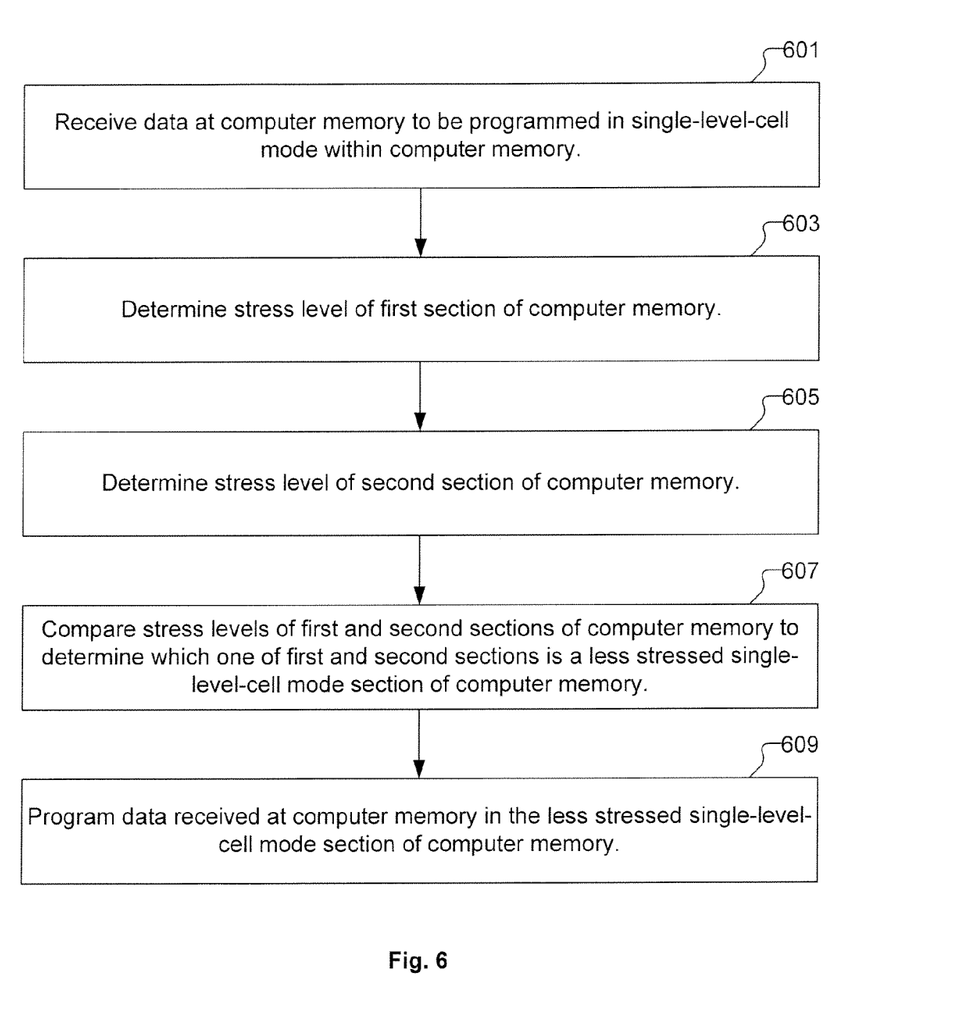
FIG. 6 shows a flowchart of a method for operating a computer memory, in accordance with one embodiment of the present invention

FIG. 6 shows a flowchart of a method for operating a computer memory, in accordance with one embodiment of the present invention. The method includes an operation 601 for receiving data at the computer memory to be programmed in single-level-cell mode within the computer memory. The method includes an operation 603 for determining a stress level of a first section of the computer memory. In some embodiments, the stress level of the first section of the computer memory is determined by calculating a percentage of expected lifetime program/erase (P/E) cycles of the first section of the computer memory that have been utilized. In some embodiments, the first section of the computer memory includes single-level-cell storage elements defined to operate in only single-level-cell mode. In some embodiments, the first section of the computer memory is an intermediate storage section of the computer memory.

The method also includes an operation 605 for determining a stress level of a second section of the computer memory. In one embodiment, the stress level of the second section of the computer memory is determined by calculating a percentage of expected lifetime program/erase (P/E) cycles of the second section of the computer memory that have been utilized. In some embodiments, the second section of the computer memory includes hybrid storage elements defined to operate in either single-level-cell mode or multi-level-cell mode. In some embodiments, the hybrid storage elements of the second section of the computer memory are controlled to operate in only single-level-cell mode. In some embodiments, the second section of the computer memory is a portion of a main storage section of the computer memory, where the main storage section includes another portion in which hybrid storage elements are controlled to operate in only multi-level-cell mode.

The method also includes an operation 607 for comparing the stress levels of the first and second sections of the computer memory to determine which one of the first and second sections is a less stressed single-level-cell mode section of the computer memory. The method further includes an operation 609 for programming the data received at the computer memory in the less stressed single-level-cell mode section of the computer memory.

In some embodiments the method includes operation of the computer memory in a burst mode such that any data received at the computer memory in the burst mode is designated for programming in single-level-cell mode in either the first section or the second section of the computer memory. In some embodiments, the method includes an operation for designating a portion of the first section of the computer memory as a first part of a burst reserved region of the computer memory. The burst reserved region is used for single-level-cell mode data programming operations during operation of the computer memory in the burst mode. In this case the method also includes an operation for designating a portion of the second section of the memory as a second part of the burst reserved region of the computer memory. A total size of the burst reserved region is equal to a sum of sizes of the first and second parts of the burst reserved region.

During burst mode operation, the method can further include increasing the size of the second part of the burst reserved region in the second section of the computer memory and correspondingly decreasing the size of the first part of the burst reserved region in the first section of the computer memory so as to maintain the total size of the burst reserved region, upon determining that the stress level of the first section of the computer memory is greater than the stress level of the second section of the computer memory. Similarly, the method can include increasing the size of the first part of the burst reserved region in the first section of the computer memory and correspondingly decreasing the size of the second part of the burst reserved region in the second section of the computer memory so as to maintain the total size of the burst reserved region, upon determining that the stress level of the second section of the computer memory is greater than the stress level of the first section of the computer memory.

Figure 7:
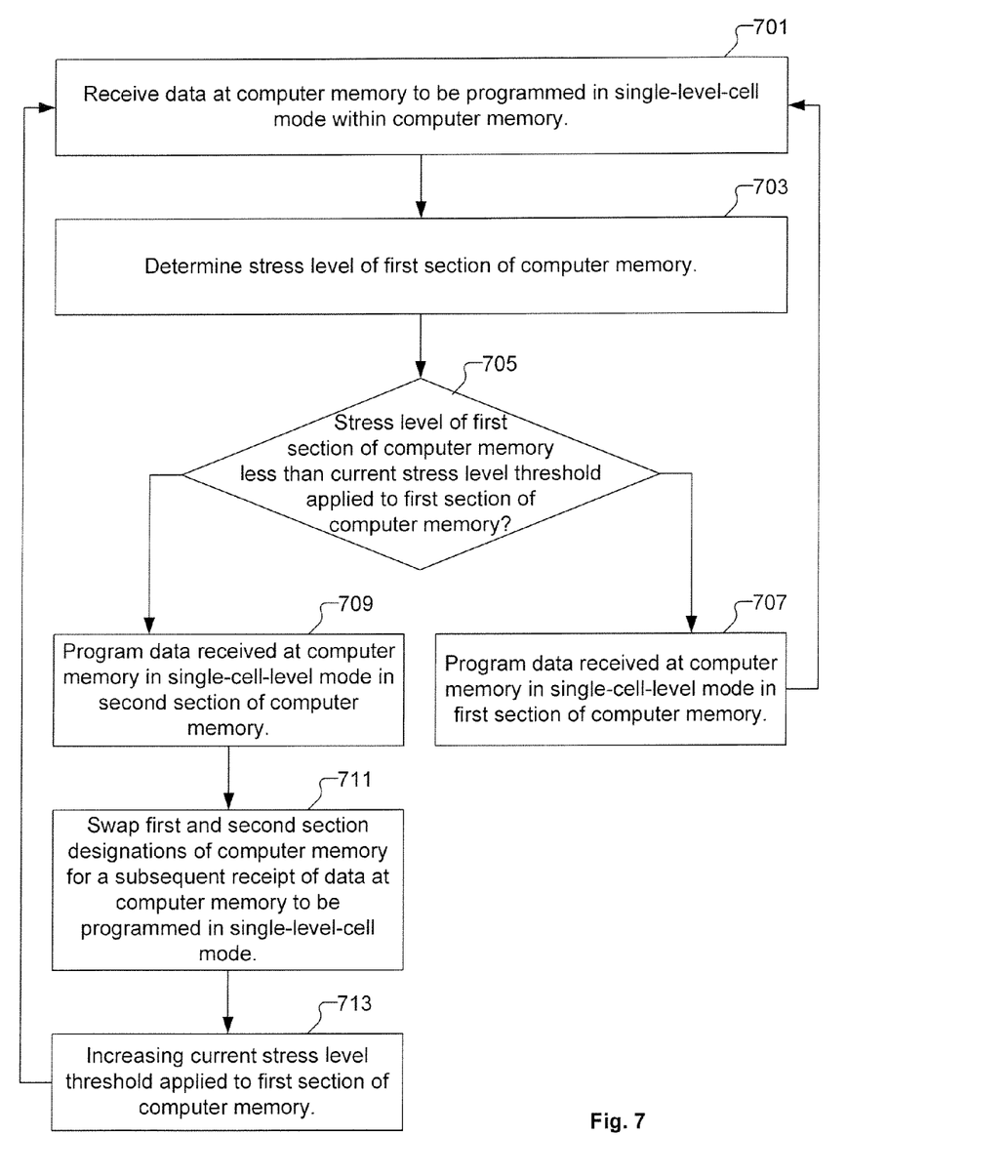
FIG. 7 shows a flowchart of a method for operating a computer memory, in accordance with one embodiment of the present invention.

FIG. 7 shows a flowchart of a method for operating a computer memory, in accordance with one embodiment of the present invention. The method includes an operation 701 for receiving data at the computer memory to be programmed in single-level-cell mode within the computer memory. The method also includes an operation 703 for determining a stress level of a first section of the computer memory. In one embodiment, the stress level of the first section of the computer memory is determined by calculating a percentage of expected lifetime program/erase cycles that have been utilized by a portion of the computer memory corresponding to the first section of the computer memory.

The method also includes an operation 705 for determining whether or not the stress level of the first section of the computer memory is less than a current stress level threshold applied to the first section of the computer memory. If operation 705 determines that the stress level of the first section of the computer memory is less than the current stress level threshold applied to the first section of the computer memory, the method proceed with an operation 707 for programming the data received at the computer memory in single-cell-level mode in the first section of the computer memory.

If operation 705 determines that the stress level of the first section of the computer memory is more than the current stress level threshold applied to the first section of the computer memory, then the method proceeds with an operation 709 for programming the data received at the computer memory in single-cell-level mode in a second section of the computer memory. From the operation 709, the method proceeds with an operation 711 for swapping the first and second section designations of the computer memory for a subsequent receipt of data at the computer memory to be programmed in single-level-cell mode. From the operation 711, the method proceeds with an operation 713 to increasing the current stress level threshold applied to the first section of the computer memory. Then, the method reverts back to operation 701 for the subsequent receipt of data at the computer memory to be programmed in single-level-cell mode.

In one embodiment, one of the first and second sections of the computer memory includes single-level-cell storage elements defined to operate in only single-level-cell mode. Also, in this embodiment, another of the first and second sections of the computer memory includes hybrid storage elements controlled to operate in only single-level-cell mode, wherein each hybrid storage element is defined to operate in either single-level-cell mode or multi-level-cell mode.

The invention described herein can be embodied as computer readable code on a non-transitory computer readable medium. The non-transitory computer readable medium mentioned herein is any data storage device that can store data which can thereafter be read by a computer system. Examples of the non-transitory computer readable medium include hard drives, network attached storage (NAS), read-only memory, random-access memory, CD-ROMs, CD-Rs, CD-RWs, solid-state digital data storage devices, magnetic tapes, and other optical and non-optical data storage devices. The non-transitory computer readable medium can also be multiple data storage devices distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the memory system implementing the methods as described herein for balancing stress/wear between different SLC mode sections of the memory can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for operating a computer memory, comprising:
   receiving data at the computer memory to be programmed in single-level-cell mode within the computer memory;
   determining a stress level of a first section of the computer memory, wherein the stress level of the first section of the computer memory is determined by calculating a percentage of expected lifetime program/erase cycles of the first section of the computer memory that have been utilized;
   determining a stress level of a second section of the computer memory, wherein the stress level of the second section of the computer memory is determined by calculating a percentage of expected lifetime program/erase cycles of the second section of the computer memory that have been utilized;
   comparing the stress levels of the first and second sections of the computer memory to determine which one of the first and second sections is a less stressed single-level-cell mode section of the computer memory;
   programming the data received at the computer memory in the less stressed single-level cell mode section of the computer memory;
   designating a portion of the first section of the computer memory as a first part of a burst reserved region of the computer memory;
   designating a portion of the second section of the memory as a second part of the burst reserved region of the computer memory, a total size of the burst reserved region equal to a sum of sizes of the first and second parts of the burst reserved region;

upon determining that the stress level of the first section of the computer memory is greater than the stress level of the second section of the computer memory, increasing the size of the second part of the burst reserved region in the second section of the computer memory and correspondingly decreasing the size of the first part of the burst reserved region in the first section of the computer memory so as to maintain the total size of the burst reserved region; and upon determining that the stress level of the second section of the computer memory is greater than the stress level of the first section of the computer memory, increasing the size of the first part of the burst reserved region in the first section of the computer memory and correspondingly decreasing the size of the second part of the burst reserved region in the second section of the computer memory so as to maintain the total size of the burst reserved region.

2. A method for operating a computer memory as recited in claim 1, wherein the first section of the computer memory includes single-level-cell storage elements defined to operate in only single-level-cell mode.

3. A method for operating a computer memory as recited in claim 2, wherein the first section of the computer memory is an intermediate storage section of the computer memory.

4. A method for operating a computer memory as recited in claim 2, wherein the second section of the computer memory includes hybrid storage elements defined to operate in either single-level-cell mode or multi-level-cell mode.

5. A method for operating a computer memory as recited in claim 4, wherein the hybrid storage elements of the second section of the computer memory are controlled to operate in only single-level-cell mode.

6. A method for operating a computer memory as recited in claim 4, wherein the second section of the computer memory is a portion of a main storage section of the computer memory, the main storage section including another portion in which hybrid storage elements are controlled to operate in only multi-level-cell mode.

7. A method for operating a computer memory as recited in claim 1, further comprising:
operating the computer memory in a burst mode such that any data received at the computer memory in the burst mode is designated for programming in single-level-cell mode in the burst reserved region in either the first section or the second section of the computer memory.

8. A method for operating a computer memory as recited in claim 1, wherein the method is embodied as program instructions stored on a non-transitory computer readable medium, the program instructions executable by a computer processor.

9. A method for operating a computer memory, comprising:
receiving data at the computer memory to be programmed in single-level-cell mode within the computer memory;
determining a stress level of a first section of the computer memory;
if the stress level of the first section of the computer memory is less than a current stress level threshold applied to the first section of the computer memory, then programming the data received at the computer memory in single-cell-level mode in the first section of the computer memory; and
if the stress level of the first section of the computer memory is more than the current stress level threshold applied to the first section of the computer memory, then 1) programming the data received at the computer memory in single-cell-level mode in a second section of the computer memory, and 2) then swapping the first and second section designations of the computer memory for a subsequent receipt of data at the computer memory to be programmed in single-level-cell mode, and 3) increasing the current stress level threshold applied to the first section of the computer memory upon swapping the first and second section designations of the computer memory.

10. A method for operating a computer memory as recited in claim 9, wherein the stress level of the first section of the computer memory is determined by calculating a percentage of expected lifetime program/erase cycles that have been utilized by a portion of the computer memory corresponding to the first section of the computer memory.

11. A method for operating a computer memory as recited in claim 9, wherein one of the first and second sections of the computer memory includes single-level-cell storage elements defined to operate in only single-level-cell mode; and
wherein another of the first and second sections of the computer memory includes hybrid storage elements controlled to operate in only single-level-cell mode, wherein each hybrid storage element is defined to operate in either single-level-cell mode or multi-level-cell mode.

12. A method for operating a computer memory as recited in claim 9, wherein the method is embodied as program instructions stored on a non-transitory computer readable medium, the program instructions executable by a computer processor.

13. A computer memory system, comprising:
a NAND-based memory structure including an intermediate storage section and a main storage section, the intermediate storage section including single-level-cell storage elements, the main storage section including hybrid storage elements defined to operate in either a single-level-cell mode or a multi-level-cell mode, the main storage section including a first portion having hybrid storage elements controlled to operate only in the single-level cell mode, the main storage section including a second portion having hybrid storage elements controlled to operate in only the multi-level-cell mode; and
a memory controller defined to designate a portion of the intermediate storage section as a first part of a burst reserved region, the memory controller defined to designate some of the first portion of the main storage section as a second part of the burst reserved region, a total size of the burst reserved region equal to a sum of sizes of the first and second parts of the burst reserved region,
the memory controller defined to receive data to be programmed in single-level-cell mode within the NAND-based memory structure,
the memory controller defined to determine a stress level of the intermediate storage section, wherein the stress level of the intermediate storage section is determined by calculating a percentage of expected lifetime program/erase cycles of the intermediate storage section that have been utilized,
the memory controller defined to determine a stress level of the first portion of the main storage section, wherein the stress level of the first portion of the main storage section is determined by calculating a percentage of expected lifetime program/erase cycles of the first portion of the main storage section that have been utilized, the memory controller defined to compare the stress levels of the intermediate storage section and the first portion of the main storage section to determine which one of the intermediate storage section and the first portion of the main storage section is a less stressed single-level-cell mode section, the memory controller defined to program the received data in the less stressed single-level-cell mode section, the memory controller defined to increase the size of the second part of the burst reserved region in the first portion of the main storage section and correspondingly decrease the size of the first part of the burst reserved region in the intermediate storage section so as to maintain the total size of the burst reserved region upon determining that the first portion of the main storage section is the less stressed single-level-cell mode section, and the memory controller defined to increase the size of the first part of the burst reserved region in the intermediate storage section and correspondingly decrease the size of the second part of the burst reserved region in the first portion of the main storage section so as to maintain the total size of the burst reserved region upon determining that the intermediate storage section is the less stressed single-level-cell mode section.

14. A computer memory system as recited in claim 13, wherein the memory controller is defined to operate the computer memory system in a burst mode such that any data received in the burst mode is designated for programming in single-level-cell mode in the burst reserved region in either the intermediate storage section or the first portion of the main storage section.

* * * * *